(12) United States Patent
Willigan et al.

(10) Patent No.: US 8,692,106 B2
(45) Date of Patent: Apr. 8, 2014

(54) BULK-PROCESSED, ENHANCED FIGURE-OF-MERIT THERMOELECTRIC MATERIALS

(75) Inventors: Rhonda R. Willigan, Manchester, CT (US); Susanne M. Opalka, Glastonbury, CT (US); Joseph V. Mantese, Ellington, CT (US); Slade R. Culp, Coventry, CT (US); Jefferi J. Covington, South Glastonbury, CT (US)

(73) Assignee: Carrier Corporation, Farmington, CT (US)

( * ) Notice: Subject to any disclaimer, the term of this patent is extended or adjusted under 35 U.S.C. 154(b) by 241 days.

(21) Appl. No.: 13/139,744

(22) PCT Filed: Dec. 7, 2009

(86) PCT No.: PCT/US2009/066959
§ 371 (c)(1),
(2), (4) Date: Jun. 15, 2011

(87) PCT Pub. No.: WO2010/080279
PCT Pub. Date: Jul. 15, 2010

(65) Prior Publication Data
US 2011/0248210 A1    Oct. 13, 2011

Related U.S. Application Data

(60) Provisional application No. 61/139,270, filed on Dec. 19, 2008.

(51) Int. Cl.
*H01L 35/12* (2006.01)
*H01L 35/16* (2006.01)
*H01L 35/22* (2006.01)
*H01L 35/14* (2006.01)
*H01L 35/20* (2006.01)

(52) U.S. Cl.
USPC ......... 136/236.1; 136/238; 136/239; 136/240

(58) Field of Classification Search
CPC .......... H01L 35/16; H01L 35/18; H01L 35/26
USPC ....................... 136/201, 236.1, 238, 240, 241
See application file for complete search history.

(56) References Cited

U.S. PATENT DOCUMENTS 5,108,515 A * 4/1992 Ohta et al. .................... 136/201
(Continued)

OTHER PUBLICATIONS

PCT International Preliminary Report on Patentability and Written Opinion of the International Searching Authority for International Application No. PCT/US2009/066959, Jun. 30, 2011, 5 pages.
Zhao et al, "Thermoelectric and mechanical properties on nano-SiC-dispersed Bi 2 Te3 fabricated by mechanical alloying and spark plasma sintering", Journal of Alloys and Compounds 455 (2008) 259-264, Available online Jan. 12, 2007, pp. 259-264, Beijing, China.

(Continued)

*Primary Examiner* — Eli Mekhlin
(74) *Attorney, Agent, or Firm* — Cantor Colburn LLP

(57) ABSTRACT

The invention is a bulk-processed thermoelectric material and a method for fabrication. The material measures at least 30 microns in each dimension and has a figure of merit (ZT) greater than 1.0 at any temperature less than 200° C. The material comprises at least two constituents; a host phase and a dispersed second phase. The host phase is a semiconductor or semimetal and the dispersed phase of the bulk-processed material is comprised of a plurality of inclusions. The material has a substantially coherent interface between the host phase and the dispersed phase in at least one crystallographic direction.

42 Claims, 9 Drawing Sheets

(56) References Cited

U.S. PATENT DOCUMENTS

| | | | |
|---|---|---|---|
| 2002/0100499 A1* | 8/2002 | Hayashi et al. | 136/238 |
| 2006/0102224 A1 | 5/2006 | Chen et al. | |
| 2006/0243314 A1* | 11/2006 | Ota et al. | 136/200 |
| 2006/0272697 A1* | 12/2006 | Kanatzidis et al. | 136/238 |
| 2007/0095383 A1* | 5/2007 | Tajima | 136/238 |
| 2008/0202575 A1 | 8/2008 | Ren et al. | |

OTHER PUBLICATIONS

Bed Poudel, et al., "High-Thermoelectric Performance of Nanostructured Bismuth Antimony Telluride Bulk", Science AAAS, May 2, 2008, vol. 320, pp. 634-638, Boston, Massachusetts.

* cited by examiner

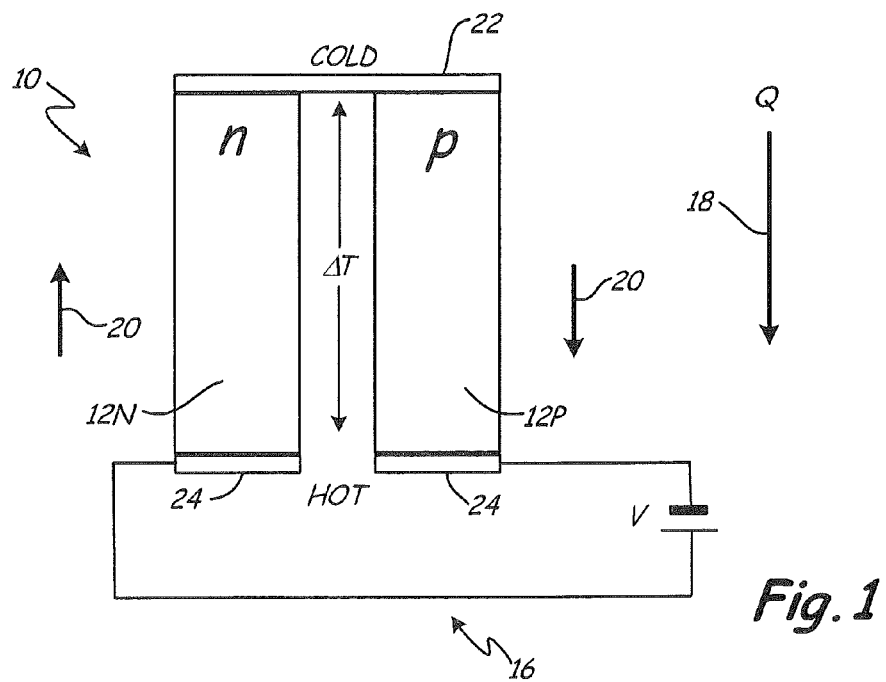
Fig. 1
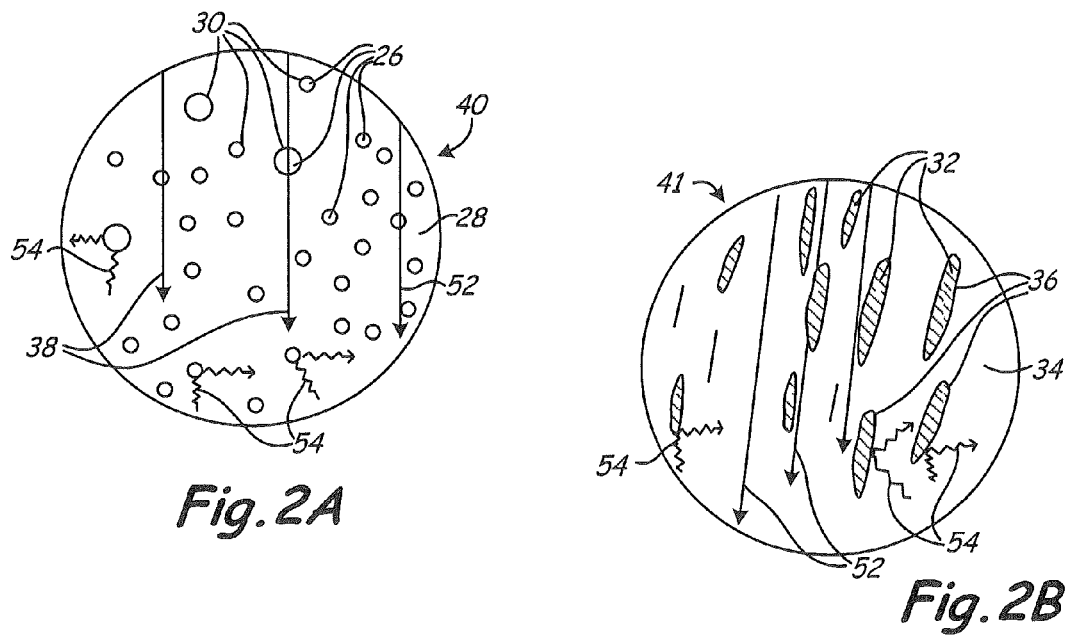
Fig. 2A
Fig. 2B

BULK-PROCESSED, ENHANCED FIGURE-OF-MERIT THERMOELECTRIC MATERIALS

BACKGROUND

The present invention relates to the structure and performance of materials with useful thermoelectric characteristics at temperatures less than 200° C., and the production thereof by less expensive bulk material processing techniques.

Thermoelectric materials exhibit a predictable relationship between their electrical and thermal performance. Depending on the desired outcome, a thermoelectric apparatus is frequently arranged as either a cooling/heat pump device or as an electrical power generator. To use the material as a cooling device or heat pump, an electric field is applied across the material, typically via an electric circuit. This field generates a thermal gradient according to the Peltier effect so long as it is maintained. Heat can be removed from the hot side of the material by a heat sink, heat exchanger or other heat removing means. When both are done simultaneously, the apparatus then operates effectively as a cooling device or heat pump. Conversely, creating a thermal gradient across the material, such as by application of thermal energy, induces an electric field according to the Seebeck effect. Connecting the material to a circuit aligned with this field causes the apparatus to operate effectively as an electrical power generator.

There are numerous benefits of applying thermoelectric materials to cooling and electrical power generation. The total size of the thermoelectric materials and ancillary parts of a thermoelectric cooling apparatus can be relatively small compared to the size of an equivalent cooling system with typical components. Most typical cooling systems in current production utilize a vapor compression system, which requires at least a compressor, a working fluid, an expansion valve, an evaporator, and a condenser. Likewise, typical power generation facilities utilize large steam turbines to convert heat energy into electricity. A thermoelectric apparatus is smaller because there is less need to house this large, expensive equipment to convert energy from one form to another. This reduces the amount of space necessary to operate a cooling or power generation system, saving valuable functional space for a manufacturer, designer, or builder. Therefore, the compact size of thermoelectric materials the makes them ideal for many cooling and power generation applications where space is at a premium.

End users also benefit from the virtual maintenance-free operation of a thermoelectric apparatus. Typical systems as described above use mechanical intermediaries to convert energy between a thermal form and an electrical form, while thermoelectric materials directly convert thermal energy to electrical energy without the need for mechanical intermediaries. Moving parts such as turbines, motors, and pumps, even if reliable, typically require periodic inspection and maintenance to minimize unplanned outages and major repairs and tend to reduce overall efficiencies. A thermoelectric apparatus has fewer such ancillary parts, and therefore fewer opportunities for system downtime.

Despite the size and maintenance advantages over current systems, thermoelectric materials have to date been limited to certain niche and specialty applications. Key factors limiting widespread adoption of the technology are high production costs combined with the practical size requirements for thin film materials. The achievable thermoelectric performance of current materials, especially those designed to operate near room temperature, is also inadequate to make thermoelectric cooling systems competitive for many large scale operations, further restricting broad adoption of current thermoelectric technology.

Current thermoelectric materials are best suited for applications with virtually no cost restrictions, that have a significant size constraint, or where reliability is more critical than efficiency. For example, current power generation applications include those in remote unattended land-based or space-based operations. Cooling technology using thermoelectric materials is generally limited to small-scale cooling applications, particularly in the medical and scientific fields. Thermoelectric cooling is penetrating the consumer market in certain specialty products such as portable refrigeration units and heated/cooled automotive seats. Each of these applications have particular reliability or size requirements that make thermoelectric cooling more attractive than standard vapor compression systems. In these applications, specialized needs outweigh the limited performance available from current thermoelectric materials.

The performance of a thermoelectric material is characterized by its dimensionless figure-of-merit, ZT:

$$ZT \equiv \frac{S^2}{\rho k} T_M \qquad [1]$$

where $\rho$ is the electrical resistivity, S is the Seebeck coefficient or thermoelectric power, $T_M$ is the average of the hot and cold side temperatures, and k is the thermal conductivity. In this equation, thermal conductivity, k, is the sum of an electrical contribution, $k_{el}$, and a phonon contribution $k_{ph}$, also expressed as $k = k_{el} + k_{ph}$.

As ZT increases, so does the conversion efficiency. While it is desirable to increase ZT by increasing S or decreasing $\rho$ or k, there has been limited progress in the ability to beneficially change only one factor without causing a counteracting change in the other. For example, $k_{el}$ and $\rho$ are related by the Wiedemann-Franz law, so that a decrease in $\rho$ typically causes an offsetting increase in $k_{el}$, resulting in no significant improvement. A reduction in $k_{el}$ can similarly cause an offsetting increase in $\rho$. These offsetting changes in $k_{el}$ and $\rho$ typically result in no significant improvement in ZT. Most advances in thermoelectric performance have come from fabricating materials with reduced $k_{ph}$.

However, selective reduction in $k_{ph}$ has generally been possible only with labor and capital intensive thin film processes such as chemical vapor deposition. These processes reduce $k_{ph}$ by creating successive phonon blocking layers or inclusions in one or two dimensions by building the materials several atoms at a time, but not in bulk. These current fabrication processes and their associated costs limit the size, performance, and application of thermoelectric materials.

Not only do thin film products have a high production cost per unit volume, there are also practical size limits on materials produced via this process. Limits on thin film thermoelectric materials begin to arise in materials with thickness less than about 30 microns. At that level, parasitic losses begin to degrade overall device performance compared to the performance at the material level. Therefore, while vapor-deposited materials have relatively high ZT at room temperature, larger dimensioned thermoelectric materials are prohibitively expensive and insufficient for all but the most cost-insensitive applications.

SUMMARY

The present invention is a bulk-processed thermoelectric material, and a method for producing the same. The material has dimensions of at least about 30 µm in each dimension, has at least one phase dispersed within a host phase, and exhibits good thermoelectric performance with a thermoelectric figure of merit of at least about 1.0 at temperatures less than 200° C. The dispersed phase comprises a plurality of inclusions which form at least a partially coherent interface with matched interatomic distances of at least one shared atom with the host phase in at least one crystallographic direction.

The method used to produce such a material includes selecting at least two starting materials that will form a host phase and a dispersed phase, then combining the materials by liquid phase or solid state precursor processing to form a dispersed phase in a matrix. The distribution, size, morphology, interfacial registry and electronic characteristics of the dispersed phase can be expediently and implicitly controlled by design of composition and processing (thermal, mechanical) parameters, without requiring the need for high-intensity and expensive thin film, nano-templating or atomic-manipulation fabrication/processing.

BRIEF DESCRIPTION OF THE DRAWINGS

FIG. 1 is a schematic depiction of a thermoelectric cooling apparatus with bulk thermoelectric materials integrated into the apparatus.

FIG. 2A is an exploded cross-sectional view of the structure of a bulk thermoelectric material having dispersed spheroidal inclusions of a second material within a host phase of a first material.

FIG. 2B is an exploded cross-sectional view of the structure of a bulk thermoelectric material having dispersed lamellar or rod-like inclusions of a second material within a host phase of a first material.

DETAILED DESCRIPTION

Figure 3A:
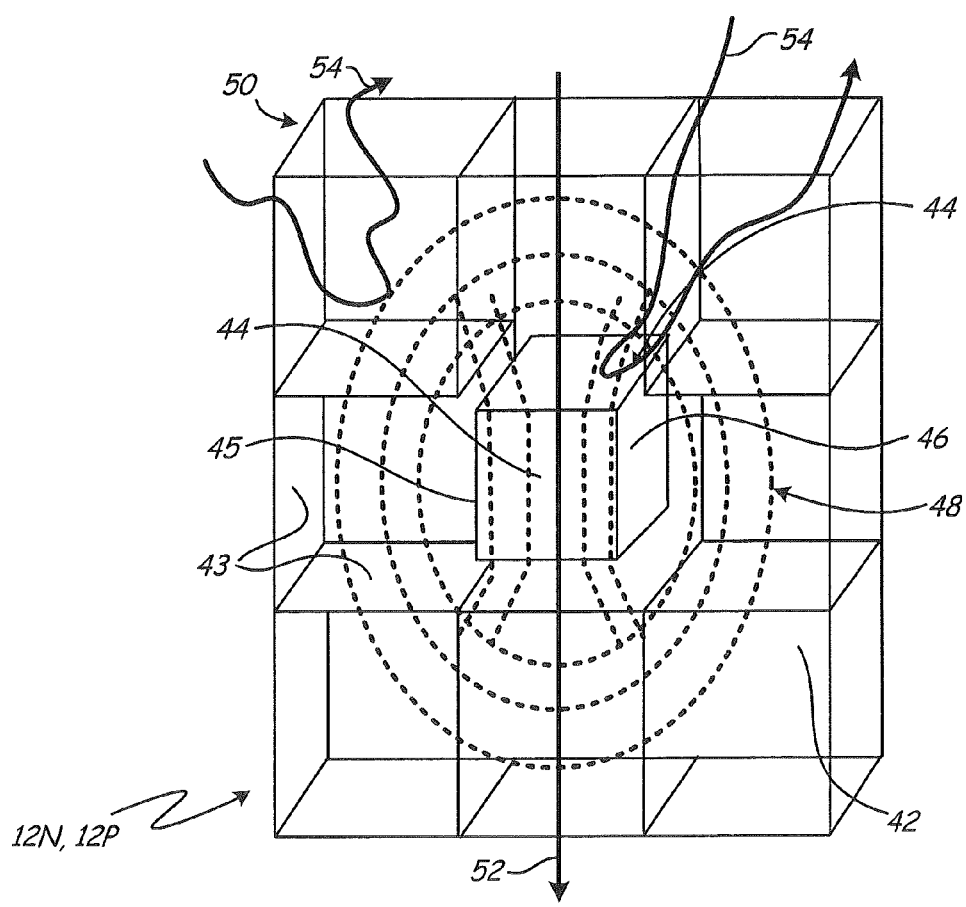
FIG. 3A is a diagram that depicts the microstructure of the bulk thermoelectric material near an inclusion and the effect of differing lattice structures on transport of phonons and charge carriers.

FIG. 1 depicts a simplified schematic of thermoelectric cooling apparatus 10 utilizing the Peltier effect to convert electrical energy into thermal gradient ΔT. Two bulk-processed thermoelectric materials, materials 12N and 12P, are shown integrated into apparatus 10. Both have ZT values of at least about 1.0 at temperatures less than 100° C. In this illustration, materials 12N and 12P are n-type and p-type materials, respectively, connected thermally in parallel and electrically in series. Those skilled in the art will recognize that more than two thermoelectric materials may be incorporated in the apparatus.

When input voltage V is applied to electrical circuit 16, current flows as indicated by arrows 20. As current passes through materials 12N and 12P, thermal gradient ΔT develops from flow of heat Q away from cold side 22 and toward hot side 24 as shown by arrow 18. Thermal gradient ΔT is maintained in materials 12N and 12P by continuous application of current in the direction indicated by arrows 20. When heat is simultaneously removed from hot side 24 via heat rejection means such as a heat sink or heat exchanger (not shown), thermal gradient ΔT is maintained across materials 12N and 12P, resulting in a similar temperature reduction on cold side 22.

Thermal gradient ΔT is caused by the relative electrical and thermal energy carried by phonons and charge carriers through the microstructure of materials 12N and 12P. By manipulating the microstructure of materials 12N and 12P as depicted in FIGS. 2A and 2B, paths for each of these particles can be selectively changed to increase the thermoelectric effect.

Materials 12N and 12P can have inclusions of various shapes as shown in FIGS. 2A and 2B. Spheroids and lamella are examples. FIG. 2A is an exploded cross-sectional view of microstructure 40 of bulk thermoelectric material 12N and/or 12P comprising dispersed spheroidal inclusions 26 of a second material within a host phase 28 comprising a first material. The contact areas between inclusions 26 and host phase 28 define at least partially coherent interfaces 30. Charge carriers 52 can be holes or electrons depending on whether the thermoelectric material is n-type material 12N or p-type material 12P. Regardless of polarity, charge carriers 52 are believed to generally pass through spheroidal inclusions 26 while phonons 54 typically scatter at interfaces 30 or within the strain fields associated with the interfaces.

FIG. 2B is an exploded cross-sectional view of microstructure 41 of bulk thermoelectric material 12N and/or 12P comprising dispersed lamellar or rod-like inclusions 32 of a second material within a host phase 34 of a first material. Similar to FIG. 2A, contact areas between inclusions 32 and host phase 34 define interfaces 36. Also, charge carriers 52 are believed to generally pass through inclusions 32 while phonons 54 generally scatter at interfaces 36 or within the strain fields associated with the interfaces.

Figure 3B:
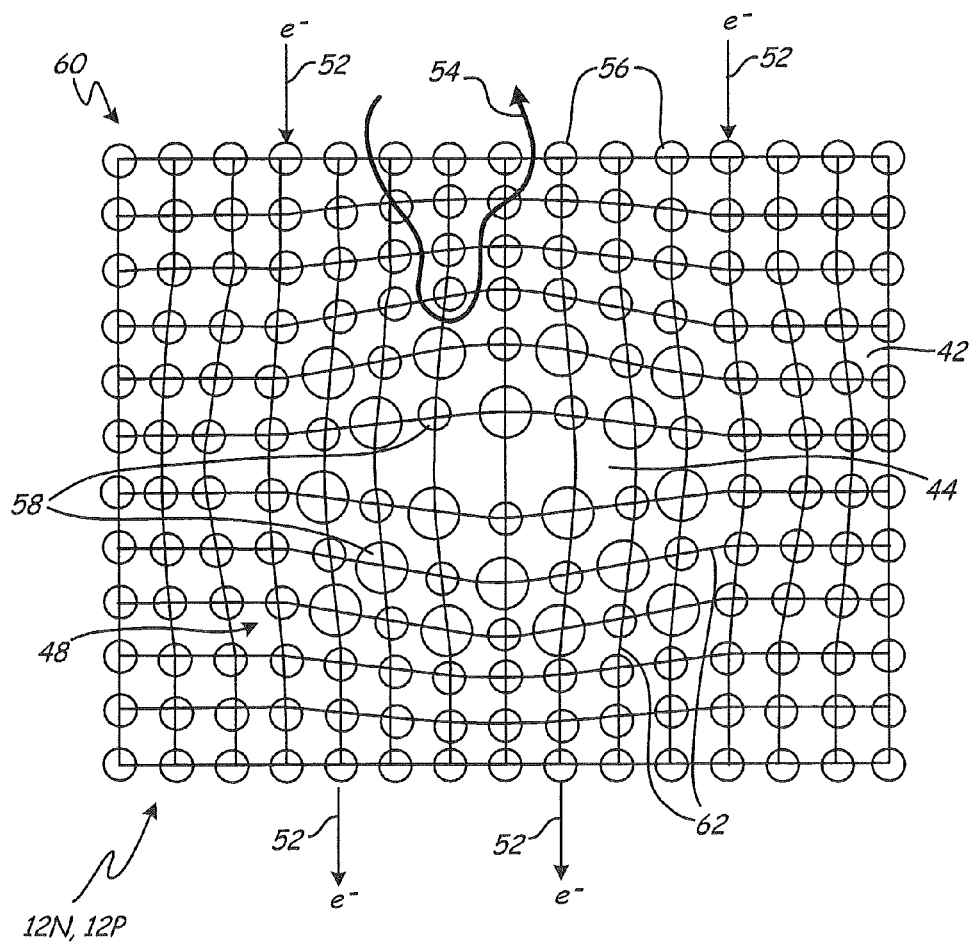
FIG. 3B is a diagram that depicts the coherent phase interface by showing the crystallographic structure of an example material.

FIGS. 3A and 3B illustrate the mechanism of this preferential scattering of phonons 54 over charge carriers 52 FIG. 3A shows how dispersed phase 44 and resulting strain field 48 operate to reduce the paths for phonons 54. FIG. 3B shows how paths remain available for charge carriers 52 by making interface 46 at least partially coherent.

The differential scattering of charge carriers 52 versus phonons 54 comes from the pathways available for each of them to travel through material 12N and/or 12P. To increase ZT, fewer pathways for phonons 54 must be available without reducing an offsetting number of pathways for charge carriers 52. Charge carriers 52 travel through chemical bonds 62, and phonons 54 are a manifestation of lattice vibrations that propagate via acoustic resonance. Preferably, thermoelectric material 12N and/or 12P should have substantially the same number of bonds 62 that host phase 42 has as a single material, while simultaneously creating lattice distortion to break up the resonance. FIG. 3A depicts how dispersed phase 44 prevents phonons 54 from propagating, and at least partially coherent interface 46 provides pathways for charge carriers 52. FIG. 3B illustrates these pathways for charge carriers 52 in more detail.

FIG. 3A depicts a single inclusion and the surrounding structure within bulk thermoelectric material 12N and/or 12P. Microstructure 50 shows dispersed phase 44 at the center surrounded by host phase 42. In FIG. 3A, host phase 42 is schematically shown as a series of parallel and perpendicular crystal planes 43. Dispersed phase 44 is shown as a rectangular solid 45 with a smaller lattice parameter than host phase 42. Interface 46 forms at the outer surface of dispersed phase 44. Host phase 42 and dispersed phase 44 are depicted as crystal planes 43 and solid 45 for ease of illustration only and may be of any relative size and shape. Dispersed phase 44 can also have a lattice parameter larger than host phase 42.

In FIG. 3A, the difference in the relative lattice parameters of dispersed phase 44 and host phase 42 creates strain field 48, depicted by dashed lines surrounding dispersed phase 44. As charge carriers 52 transport thermal energy toward hot side 24, the lattice begins to vibrate faster than cold side 22. Phonons 54 carry some of this thermal energy throughout the material as quantized vibration waves. Left alone, these vibrations cause a net transport of heat away from hot side 24. However, strain field 48 effectively scatters phonons 54 passing through bulk material 12N and/or 12P due to acoustic mismatch of the respective phases. Scattering at interface 46 makes it more difficult for the thermal energy of phonons 54 to migrate from hot side 24 to cold side 22 in FIG. 1, which is reflected in a reduced phonon contribution to thermal conductivity, $k_{ph}$. Reducing $k_{ph}$ beneficially increases ZT by reducing the overall k value in the denominator of Equation 1 above.

Equation 1 also shows that reducing the charge carrier contribution, $k_{el}$, would also beneficially increase ZT. It may appear from Equation 1 that $k_{el}$ could be reduced by reducing pathways for charge carriers. Unfortunately, the pathways used by charge carriers 52 to carry thermal energy are the same pathways that charge carriers 52 use to carry electrical energy. Therefore, scattering charge carriers at interface 46 to reduce $k_{el}$ would also result in an associated increase in electrical resistivity, $\rho$.

As a result, mobility of charge carriers 52 between host phase 42 and dispersed phase 44 must be substantially maintained in bulk material 12N and/or 12P by forming chemical bonds 62 at interface 46 in FIG. 3B. Forming chemical bonds at a phase interface increases the coherency of the interface. If interface 46 is not at least partially coherent, some or all of the beneficial increase in ZT resulting from the reduction of $k_{ph}$ is offset by an increase of $\rho$ from scattering of charge carriers 52 at interface 46.

FIG. 3B schematically illustrates the bond distortion in a single crystal due to a coherent inclusion with a larger lattice parameter in a matrix with a smaller lattice parameter. The coherent inclusion could also have a smaller lattice parameter in a matrix with a larger lattice parameter. FIG. 3B also illustrates the effect of this structure on mobility of phonons 54 and charge carriers 52. Instead of two separate lattices, making interface 46 at least partially coherent effectively creates a single distorted lattice 60. At the center of distorted lattice 60, the shaded area represents dispersed phase 44. Host phase 42 surrounds dispersed phase 44. Host phase 42 comprises host phase atoms 56 and dispersed phase 44 comprises dispersed phase atoms 58 and host phase atoms 56. Host phase 42 could have two or more different atom types and dispersed phase 44 could also have two or more different atom types where at least one of the atoms being the same element. Interface 46 is at least partially coherent when a plurality of chemical bonds 62 form between host phase atoms 56 and dispersed phase atoms 58. As shown in FIG. 3B, mobility of charge carriers 52 is supported by maintaining at least a portion of the original number of bonds 62 through the material, particularly across interface 46.

As discussed above, to increase ZT in material 12N and/or 12P compared to host phase 42, the addition of dispersed phase 44 to host phase 42 must cause a relative reduction in $k_{ph}$ greater than the resulting increase in $\rho$. To achieve a satisfactory improvement in ZT, the relative reduction in $k_{ph}$ caused by addition of dispersed phase 44 is preferably at least about 10% greater than the relative increase in $\rho$. More preferably the relative reduction in $k_{ph}$ is at least about 50% greater than the relative increase in $\rho$, and even more preferably the relative reduction in $k_{ph}$ is about 100% greater than the relative increase in $\rho$.

This preferential reduction in $k_{ph}$ over an increase in $\rho$ generally results in an overall reduction of the product of thermal conductivity and electrical resistivity $\rho k$. As described above, if $\rho k$ is reduced, the overall figure of merit ZT increases over that of host phase 42. Here, the addition of dispersed phase 44 causes an overall reduction in $\rho k$, and a resulting increase in ZT of preferably at least about 10% over host phase 42. The increase in ZT is more preferably at least about 50% greater and most preferably at least about 100% greater than host phase 42 without dispersed phase 44.

As shown in FIG. 3B, reduction of $k_{ph}$ by preferential phonon scattering is achieved by establishing at least partial coherency of interface 46. The potential for coherency depends on two key attributes of host phase 42 and dispersed phase 44. The presence of one or both attributes increases the likelihood of coherency and thus preferential scattering of phonons 54. One attribute in determining coherency is the relative compatibility and alignment of atom spacings between host phase 42 and dispersed phase 44. A second attribute, seen in several embodiments of the invention, is the sharing of at least one chemical element in common between host phase 42 and dispersed phase 44.

The alignment of similar atom spacings ensures that the overall crystal structure of host phase 42 is not significantly deformed by the presence of dispersed phase 44. As shown in FIG. 3A, substantial lattice deformation occurs at interface 46 and induces a strong strain field 48. Strain field 48 is schematically depicted by dashed lines surrounding dispersed phase 44. As can be seen from FIG. 3B, bonds 62 will break at interface 46 if the strain field is large enough, thereby reducing pathways for charge carriers 52. Similar interatomic spacings of like atoms allow phases 42 and 44 to substantially align throughout material 12N and/or 12P, thereby maintaining chemical bonds 62 between phases 42 and 44 as paths for charge carriers 52. This promotes lower electrical resistivity, $\rho$, and structural stability of the bulk-processed material at interface 46 in at least one crystallographic direction.

This coherency of interface 46 is optimized when the interatomic spacings of dispersed phase 44 are preferably within about ±10% of the interatomic spacings of host phase 42. The interatomic spacings of dispersed phase 44 are more preferably within about ±5% of the interatomic spacings of host phase 42, and even more preferably within about ±2% of the interatomic spacings of host phase 42. Those skilled in the art will recognize that any material of these dimensions produced by bulk-processing techniques will not be perfectly coherent and will have some imperfections, particularly in comparison to thin film techniques with nanometer-level control. However, the thermoelectric and cost performance will be improved over a thin film process for a large scale version of a given material.

In addition to lattice parameters, in several embodiments of this invention, host phase atoms 56 and dispersed phase atoms 58 share at least one chemical element in common, which facilitates formation of chemical bonds 62 between phases 42 and 44. The shared element facilitates bonding between phases because materials in phases 42 and 44 can be chosen to selectively react and disperse in an optimized melt-quench, solution heat treat, quench and age and other liquid precursor and solid state processes as known in the art.

Thermoelectric behavior is also determined in part by the selection of materials used in host phase 42 and dispersed phase 44. The materials should be selected so as to have one element in common between host phase 42 and dispersed phase 44. When host phase atoms 56 and dispersed phase atoms 58 have at least one element in common, the shared elements ensure that there are sufficient bonds 62 to maximize the potential coherency of interface 46.

The relative concentrations of dispersed phase 44 compared to host phase 42 is yet another factor affecting the coherency of interface 46. As seen in FIG. 3B, the lattice distortion caused by dispersed phase 44 extends well into host phase 42. When the concentration of dispersed phase 44 is increased, interfaces 46 and resulting distortions of host phase 42 necessarily move closer together. This reduction in space comes from a combination of larger inclusions, causing more lattice distortion in host phase 42, or from a higher frequency of inclusions in a given volume.

Substantially all inclusions are preferably greater than about 1 nm and less than 1 μm across their smallest dimension. In one embodiment, substantially all inclusions range between 10 nm and 50 nm across their smallest dimension. In another embodiment, the material comprises a broad range of inclusions with about half ranging between about 10 nm to 50 nm across their smallest dimension with the substantial remainder of inclusions measuring between about 2 nm and 1 μm across their smallest dimension.

In either case, this leaves less space for host phase 42 to relax the lattice distortion and strain around interface 46. When the distortion grows to a critical size, fewer bonds 62 will form at interface 46, breaking down coherency and impeding transport of charge carriers 52. This lack of coherency resulting from high concentration of dispersed phase 44 thereby effectively increases ρ and $k_{el}$ directly and reduces ZT indirectly.

The opposite effect can also be seen in FIG. 3B with a low concentration of dispersed phase 44. With relatively few lattice distortions separated by large distances, there is not enough surface area at interfaces 46 to scatter phonons 54, leaving more of them free to pass from hot side 24 to cold side 22 in FIG. 1. Therefore, $k_{ph}$ is not reduced sufficiently to materially increase ZT. The density and relative surface area of dispersed phase 44 also affects thermoelectric performance. To achieve interfaces 46 with sufficient phonon scattering and electron conductivity, the ratio of the surface area to volume of substantially dispersed phase 44 is preferably greater than about 0.08 $nm^{-1}$. In one embodiment, the ratio is greater than about 0.10 $nm^{-1}$ and another embodiment, the ratio is between about 0.10 $nm^{-1}$ and about 0.30 $nm^{-1}$.

In terms of overall thermoelectric improvement based on relative phase concentrations, dispersed phase 44 comprises less than about 40% by atomic composition of the bulk-processed material. In one embodiment, dispersed phase 44 is less than about 25% by atomic composition. In other embodiments, the phase concentration is less than about 15%, and in yet other embodiments, the phase concentration of dispersed phase 44 is between about 2% and about 12%.

Figure 4:
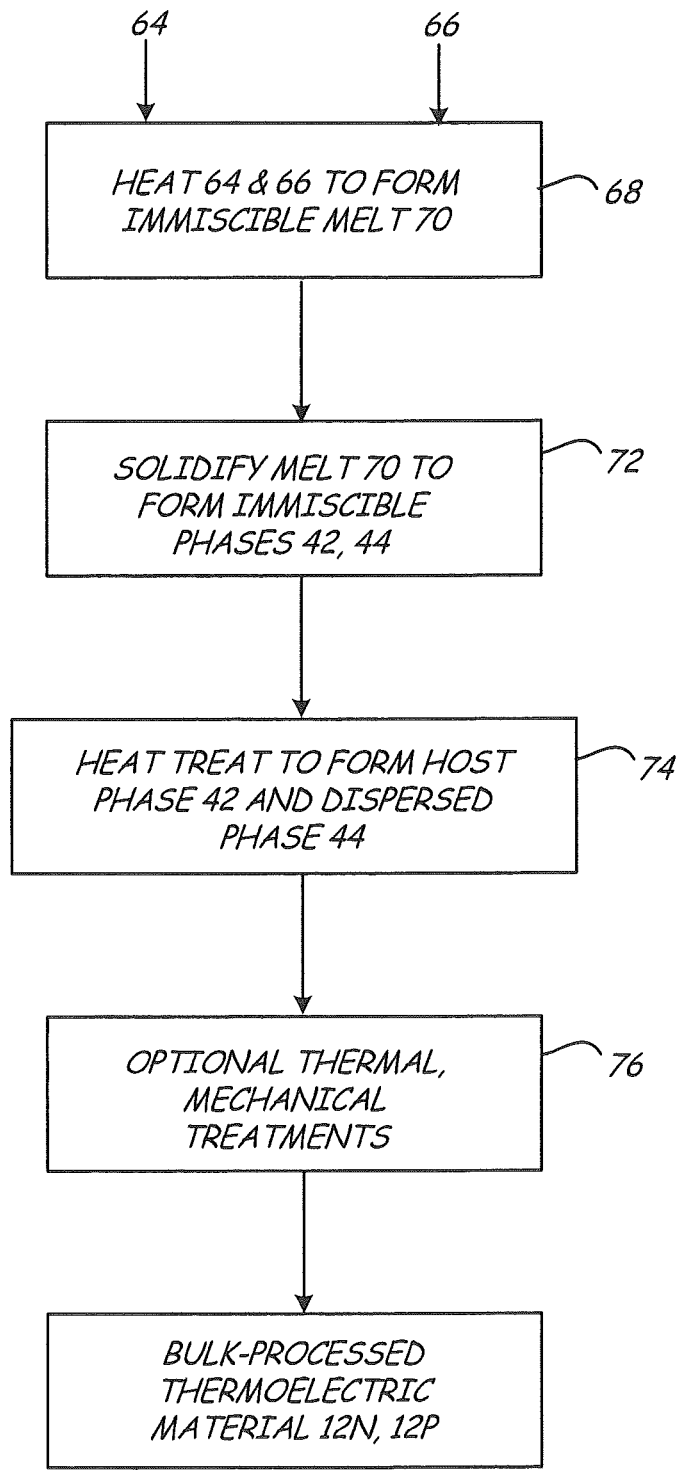
FIG. 4 is a flow chart depicting a method of fabricating a bulk-processed thermoelectric material.

FIG. 4 depicts a method of making thermoelectric material 12N and/or 12P containing dispersed phase 44 with coherent interfaces 46 according to the present invention. The method comprises mixing and heating a first material 64 and a second material 66 at step 68 to form melt 70. The chemical compositions of starting materials 64 and 66 are selected or intentionally formulated to create melt 70. Melt 70 is then solidified to form a single or multiple-phase solid in step 72. After solidification, the material is heated again at heat treating step 74 to allow the existing phases to further separate or precipitate into formations of dispersed phase 44 and to allow the host, or matrix, phase to homogenize. Dispersed phase 44 can form as any combination of spheroids, lamellar or rod-like structures, or as other shapes known to those in the art. After heat treatment step 74, the material can be optionally treated by standard thermal and/or mechanical means known in the art at step 76.

Selecting initial materials 64 and 66 to form thermoelectric material 12N and/or 12P is particularly important to maximize the thermoelectric performance of the material. First, it is preferable for host phase 42 to have commercially acceptable single-phase ZT values. Typically, semiconductors or semimetals are the best materials for this purpose because they have higher ZT than other classes of materials and are thus preferable materials for host phases 28 and 34. In FIGS. 2A and 2B, ZT is increased by adding or manipulating these structural features within host phases 28 and 34.

Second, materials with strong bonding affinity for host phase material 42 are considered as candidates for dispersed phase 44. Preferably, materials having an element in common with host phase 42 are good candidates for dispersed phase 44. Third, out of the potential candidates, materials are selected that will phase separate from a melt to form host phase 42 and dispersed phase 44. Selection can be done by any number of methods, including examining binary phase diagrams to find materials where the elements of host phase 42 and dispersed phase 44 that are not common to each other do not alloy in the solid phase. Finally, of the remaining candidates for dispersed phase 44, lattice parameters of host phase 42 and dispersed phase 44 are compared and matched according to the limits discussed above to ensure adequate coherency of interface 46.

In another embodiment, phase systems are selected that exhibit a single phase field with a boundary with an adjacent multiple phase field whose solubility decreases with decreasing temperature leading to the potential of forming a supersaturated solid solution by quenching. Subsequent aging to precipitate one or more dispersed phases 44 can lead to materials with elevated ZT values.

Once the materials are selected, there are several methods of facilitating heating step 68 and solidification step 72. The particular solidification processes in step 72 are designed around initial materials 64 and 66 to selectively induce phase immiscibility between host phase 42 and dispersed phase 44. In addition to the two step melt-quench process described in the example above, other embodiments of the invention include splat quenching, ribbon spinning, or inert gas powder atomization followed by post powder formation consolidation. Other embodiments include vacuum casting, mechanical alloying, mechanical mixing, directional solidification, injection mold processing, and reduction from an oxide.

Heat treatment step 74 is also designed around the previous steps with a goal to achieve desired at least partial coherency and lattice match between phases 42 and 44 in one or more crystallographic directions. Other purposes of heat treatment step 74 include enhancing phase separation and matrix, or host phase, homogenization.

Optional treatments step 76 are intended to further process the bulk-processed material, if necessary, to tailor or optimize thermoelectric and structural properties of the bulk-processed material. Two examples of such thermal and mechanical treatments include hot forging and elevated-temperature extrusion for overall particle alignment or texturing. Optional treatment step 76 can also be used to aid in further dispersion or isolation of any inclusion colonies 80 as shown below in FIG. 5A that may form in the bulk-processed material. In some embodiments of the invention, dispersed phase 44 comprises materials with various degrees of thermal conductivity as well as various degrees of electrical conductivity, which further refines the thermoelectric properties of material 12N and/or 12P.

EXAMPLE 1

One embodiment of the method depicted in FIG. 5 can be seen by way of example 1. In this example, a bismuth telluride—gallium telluride phase separated, bulk thermoelectric nanocomposite material with at least partially coherent interfaces is created. First material 64 is 4.662 g of bismuth telluride powder, 99.98% purity. Second material 66 is a combination of 0.09 g of gallium metal, 99.9999% purity in 6 mm diameter pellets, and 0.248 g of tellurium powder, 99.99% purity, 325 mesh. The reagents are commercially available from laboratory supply companies such as Aldrich and Alfa Aesar.

These initial materials 64 and 66 were selected by the process described above. Bismuth telluride is an acceptable thermoelectric material and is used in several commercial applications, making it suitable for host phase 42. Gallium telluride has strong bonding affinity for bismuth telluride because of their common bridge element tellurium and the similar Te—Te spacings in each. This makes it suitable for dispersed phase 44. Further, according to the binary phase diagram, bismuth and gallium do not form an alloy at the temperatures used in the example. This ensures that bismuth telluride and gallium telluride will form out of a melt that includes bismuth, tellurium, and gallium, but also means that the melt is unlikely to form an unwanted bismuth-gallium phase or a ternary bismuth-gallium-tellurium phase. This satisfies the third factor of the selection method. Finally, the lattice parameters between host phase bismuth telluride and dispersed phase gallium telluride differ by less than 10%, thereby satisfying the final element of the selection method.

Further, the material comprising host phase 42 preferably has an acceptable ZT as a standalone material to maximize ZT in the bulk-processed material. As described in the example, host phase 42 can be a form of doped or undoped bismuth telluride. While the example discusses host phase 42 comprising undoped bismuth telluride, host phase 42 can alternatively be doped by materials including tin (Sn), antimony (Sb), lead (Pb), arsenic (As), selenium (Se), bromine (Br), and iodine (I), forming $Bi_{2-a}X_aTe_3$ or $Bi_2X_aTe_{3-a}$. Preferably, X is dopant selenium (Se) or antimony (Sb). The dopant may be selectively soluble in the host phase, and may be used to tailor p or n character.

In lieu of doping by a third element, host phase 42 can also be self-doped by a nonstoichiometric amount of bismuth or tellurium, creating either bismuth-rich bismuth telluride compositions or bismuth-poor bismuth telluride compositions. If X is Bi or Te, the above formula then becomes $Bi_{2+a}Te_3$, where about $-0.75<a<0.825$. Doping the host phase is done for any number of purposes, one of which would be to increase ZT in the overall material. Another reason to dope host phase 42 would be in order to ensure that the bulk-processed material operates as an n-type or p-type material. As an example, selectively doping host phase 42 to make a material n-type or p-type would be beneficial in an apparatus similar to that depicted in FIG. 1, where cooling apparatus 10 comprises alternating n-type and p-type materials.

While the chemical composition of host phase 42 provides the foundation for a high ZT bulk-processed material, the composition of dispersed phase 44 also is selected to increase ZT according to the steps described above. The chemical composition of dispersed phase 44 affects not only the thermoelectric performance of the bulk-processed material in its own right, but the composition relative to host phase 42 also affects interface 46. The relative chemical compositions determine lattice match and chemical bonding affinity between phases 42 and 44, the impact of which is discussed above in reference to FIGS. 3A and 3B.

To encourage coherency of interface 46, when host phase 42 is bismuth telluride, dispersed phase 44 is comprised of one or more of the following: a binary bismuth compound, a binary tellurium compound, a ternary bismuth compound, or a ternary tellurium compound. Preferably, the dispersed phase comprises a binary tellurium compound ($Y_cTe_d$), where Y is the second material in the binary tellurium compound, and both c and d reflect the stoichiometric balance of Y and Te in host phase 42. Preferably, Y is aluminum (Al), chromium (Cr), cobalt (Co), copper (Cu), indium (In), iridium (Ir), iron (Fe), gallium (Ga), germanium (Ge), molybdenum (Mo), osmium (Os), rhenium (Re), ruthenium (Ru), silicon (Si), silver (Ag), tantalum (Ta), tungsten (W), vanadium (V) or zinc (Zn). More preferably, Y is gallium (Ga), indium (In), germanium (Ge), silver (Ag), copper (Cu), or zinc (Zn); and even more preferably Y is copper (Cu) or silver (Ag).

The choice of elements listed above result in preferable dispersed phase 44 compounds of aluminum telluride ($Al_2Te_3$), chromium telluride ($Cr_2Te_3$), cobalt telluride (CoTe), copper telluride (CuTe), dicopper telluride ($Cu_2Te$), copper deficient dicopper telluride ($Cu_xTe$, where $1.0<x<2.0$), indium telluride ($In_2Te_3$), iridium telluride ($IrTe_2$), iron telluride (FeTe), gallium telluride ($Ga_2Te_3$), germanium telluride (GeTe), molybdenum telluride ($MoTe_2$), osmium telluride ($OsTe_2$), rhenium telluride ($ReTe_2$), ruthenium telluride ($RuTe_2$), silicon telluride ($SiTe_2$), silver telluride ($Ag_2Te$), tantalum telluride ($TaTe_2$), tungsten telluride ($WTe_2$), vanadium telluride ($VTe_2$) or zinc telluride (ZnTe). The more preferable dispersed phases would then comprise gallium telluride ($Ga_2Te_3$), germanium telluride (GeTe), silver telluride ($Ag_2Te$), copper telluride (CuTe), dicopper telluride ($Cu_2Te$), copper deficient dicopper telluride ($Cu_xTe$, where $1.0<x<2.0$), and zinc telluride (ZnTe). Even more preferable dispersed phases would comprise copper telluride (CuTe), dicopper telluride ($Cu_2Te$), copper deficient dicopper telluride $Cu_xTe$, where $1.0<x<2.0$, and silver telluride ($Ag_2Te$).

Dispersed phase 44 can also be doped to fine-tune electron conductivity and phonon scattering performance. Doping dispersed phase 44 increases or decreases the number of charge carriers in the bulk-processed material and affects the relative Fermi energy levels of the overall system, thereby controlling thermoelectric performance of the bulk-processed material. Examples of dopant elements include copper (Cu), gold (Au), lead (Pb), cadmium (Cd), nickel (Ni), zinc (Zn), platinum (Pt), mercury (Hg), magnesium (Mg), silicon (Si), boron (B), gallium (Ga), carbon (C), germanium (Ge), indium (In), tin (Sn), antimony (Sb), arsenic (As), aluminum (Al), phosphorous (P) and silver (Ag). The dopants may be selectively soluble in the dispersed phase.

After selection of $Bi_2Te_3$ and $Ga_2Te_3$, the materials were then mixed and heated via step 68 to form melt 70. Step 68 comprises mixing materials 64 and 66 in a nitrogen glovebox, placing them in a quartz ampoule, flame-sealing the ampoule under vacuum and placing it in a box furnace ramping to 800° C. at 10° C. per minute. After dwelling at 800° C. for one hour, melt 70 is quenched in an ice water bath and solidified, step 72. Step 74 then comprises the solidified ingot being placed back in the box furnace and annealed at 390° C. for 4 days to form desired aspect ratios and coherency between dispersed phase 44 and host phase 42 at interfaces 46. In this example, optional treatment 76 is skipped.

Figures 5A, 5B:
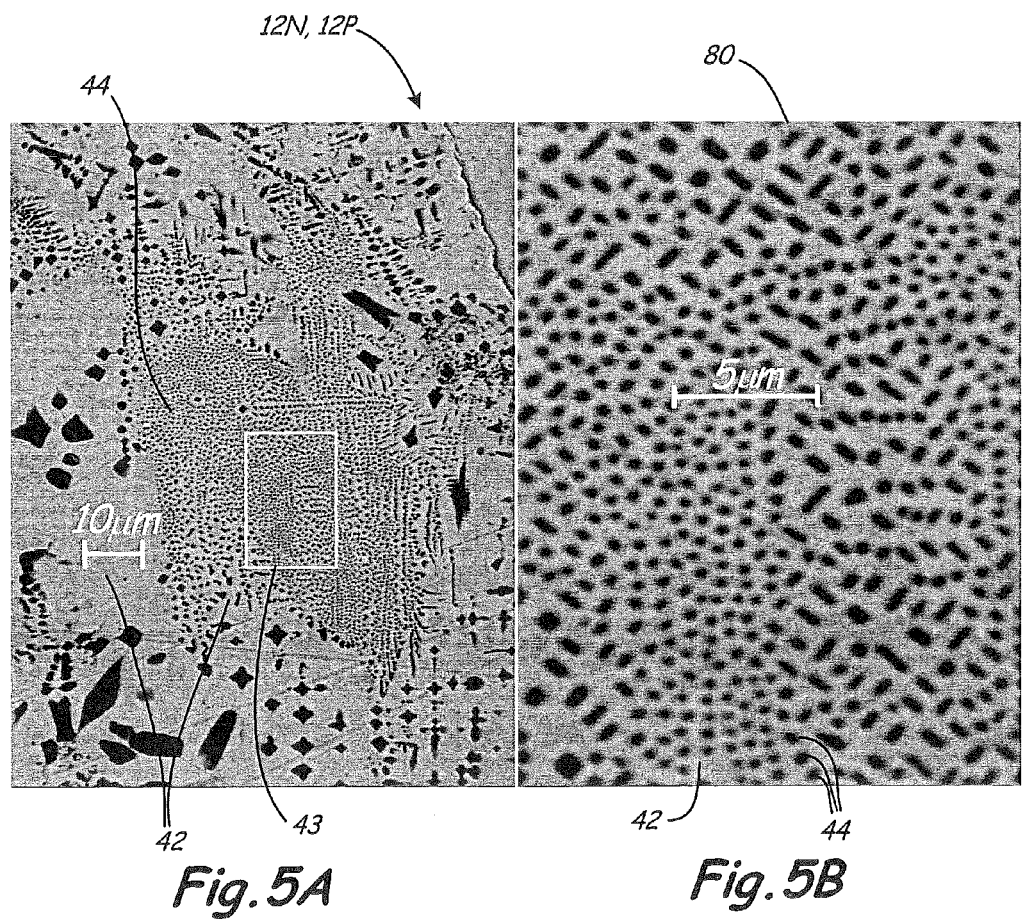
FIG. 5A is a scanning electron micrograph of a bulk processed thermoelectric material comprising gallium telluride dispersoids in a bismuth telluride matrix.
FIG. 5B is a higher magnification view of area 43 in FIG. 5A.

The microstructure of the $Bi_2Te_3$—$Ga_2Te_3$ example discussed herein comprises areas of dispersoid free bismuth telluride host phase 42 and areas of host phase 42 containing high densities of gallium telluride dispersoids. FIG. 5A is a scanning electron micrograph of a sample area of a polished section of the bismuth telluride gallium telluride sample showing dispersoid free regions of bismuth telluride host phase 42 regions and a region containing a high density of submicron gallium telluride dispersoids. Bismuth telluride host phase 42 appears as light gray and gallium telluride dispersoids 44 are black in the micrograph. FIG. 5B is a higher magnification view of area 43 in FIG. 5A. The dispersoids appear as both spherical and rectangular shapes and the majority have submicron dimensions.

EXAMPLE 2

Figure 6:
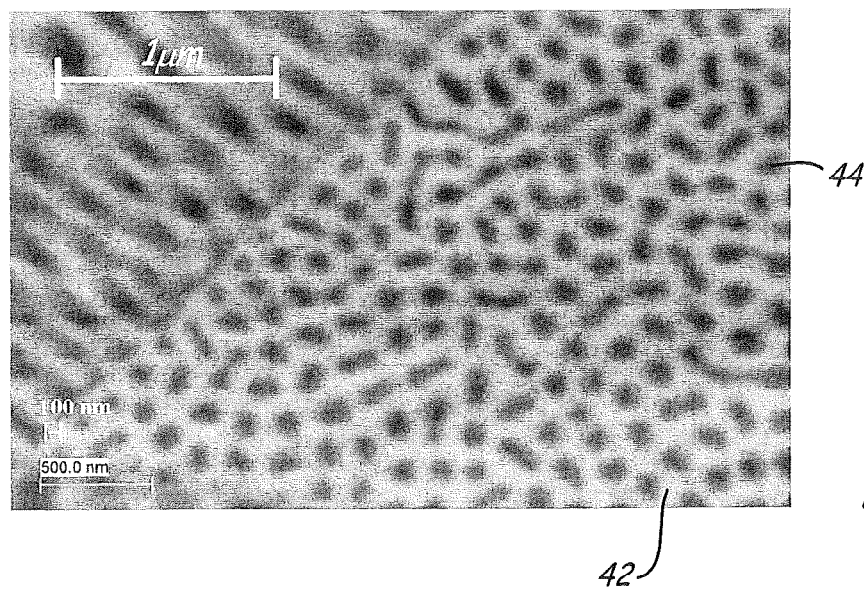
FIG. 6 is a scanning electron micrograph of spheroidal copper telluride dispersoids in a bismuth telluride selenide matrix.

FIG. 6 is a scanning electron micrograph indicating another example where dispersed phase 44 is predominantly spheroidal. In the figure dispersed phase 44 is copper telluride ($Cu_xTe_y$) and matrix phase 42 is bismuth telluride selenide ($Bi_2Te_{2.7}Se_{0.3}$). Dispersed phase 44 is black and matrix phase 42 is gray in the micrograph.

EXAMPLE 3

Figure 7:
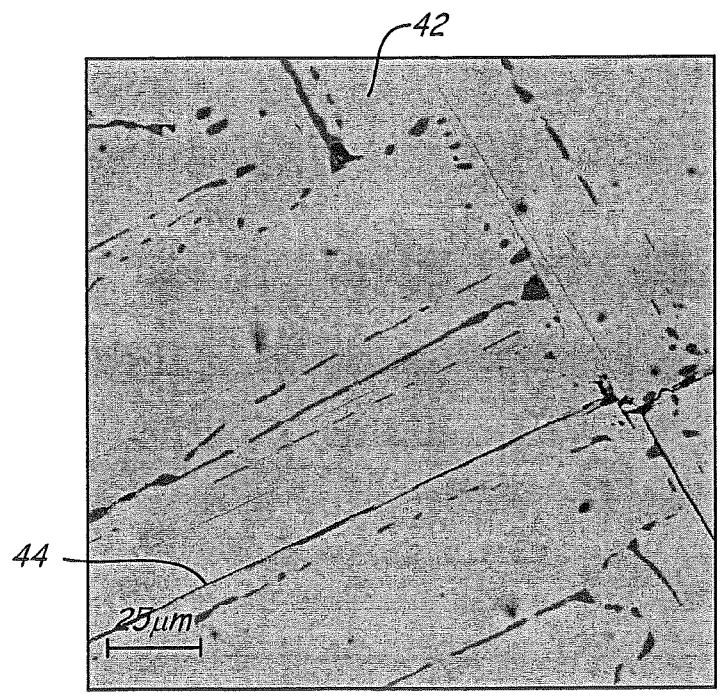
FIG. 7 is a scanning electron micrograph of lamellar copper telluride dispersoids in a bismuth telluride selenide matrix.

FIG. 7 shows an example wherein dispersed phase 44 comprises substantially lamellar or rod-like inclusions that appear to be crystallogrically related to the matrix phase. Matrix phase 42 is bismuth telluride selenide ($Bi_2Te_{2.7}Se_{0.3}$) and dispersed phase 44 is copper telluride ($Cu_xTe_y$).

EXAMPLE 4

Candidates for matrix phase 42 and dispersed phase 44 were considered according to the similarity of the tellurium atom spacings in both. The following table indicates two candidate systems with tellurium spacings of about 10 and 5 percent differences respectively.

TABLE

Comparison of Te atom spacings in candidate matrix and dispersoid materials.

| Matrix | Te-Te Spacing | Dispersoid | Te-Te Spacing | Δ Spacing |
|---|---|---|---|---|
| $Sb_{1.5}Bi_{0.5}Te_3$ | 4.297 Å | $Ag_2Te$ | 4.712 Å | 9.7% |
| $Bi_2Te_3$ | 4.395 Å | $Ga_2Te_3$ | 4.169 Å | 5.2% |

EXAMPLE 5

An example where dispersed phase 44 causes a reduction in phonon thermal conductivity ($k_{ph}$) at least about 10 percent greater than an increase in electrical resistivity ρ, compared to $k_{ph}$ and ρ of the host phase alone is given here. A material product with the composition $(BiTe_{2.7}Se_3)_{0.9}(Cu_xTe_y)_{0.1}$, where $BiTe_{2.7}Se_3$ is the host phase at 90 atomic percent loading, and $Cu_xTe_y$ is the dispersed phase at 10 atomic percent loading, was produced through a melt-quench-anneal route starting from the base elements as outline in FIG. 4. The composite material product was measured to have a lattice thermal conductivity of 0.69 W/m-K. A second material product was produced the same exact way as the $(BiTe_{2.7}Se_3)_{0.9}(Cu_xTe_y)_{0.1}$ composite phase but this time excluding the copper phase. This material product, hereafter referred to as the "baseline material," has therefore a composition of $BiTe_{2.7}Se_3$. This material was measured to have a lattice thermal conductivity of 1.14 W/m-K. The percent different between 0.69 W/m-K and 1.14 W/m-K is 39%.

EXAMPLE 6

The following is an example demonstrating a material product wherein the presence of the dispersed phase in the bulk thermoelectric causes a reduction in rho-kappa (product of the material product's electrical resistivity, ρ, and its thermal conductivity, κ) at least about 10% compared to the rho-kappa of the host phase alone. A material product with the composition $(BiTe_{2.7}Se_3)_{0.9}(Cu_xTe_y)_{0.1}$, where $BiTe_{2.7}Se_3$ is the host phase at 90 atomic percent loading, and $Cu_xTe_y$ is the dispersed phase at a 10 atomic percent loading, was produced through a melt-quench-anneal route starting from the base elements as outlined in FIG. 4. The composite material product was measured to have a rho-kappa value of 20 μohm-W/K. A second material product was produced the same exact way as the $(BiTe_{2.7}Se_3)_{0.9}(Cu_xTe_y)_{0.1}$ composite phase but this time excluding the copper phase. This material product, hereafter referred to as the "baseline material", has therefore a composition of $BiTe_{2.7}Se_3$ This material was measured to have a rho-kappa value of 80 μohm-W/K. The percent difference between 20 μohm-W/K and 80 μohm-W/K is 75%.

EXAMPLE 7

Figure 8:
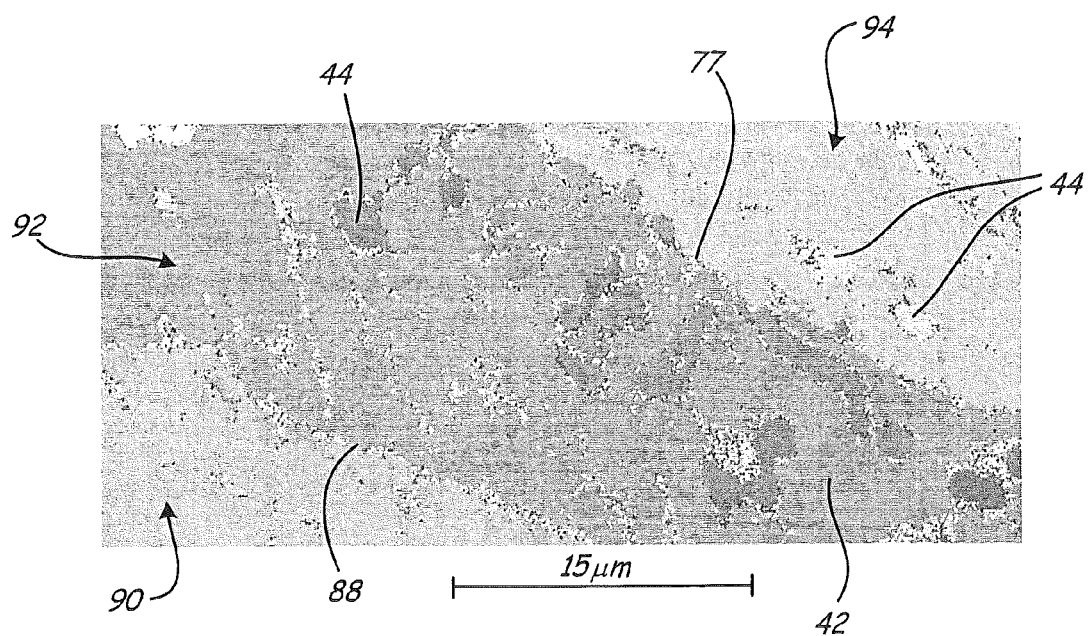
FIG. 8 is an electron backscatter diffraction (EBSD) image of gallium telluride dispersed phase in a bismuth telluride matrix. The image shown is an inverse pole map of the EBSD image.

An example of at least partial dispersed phase 44 epitaxy with matrix phase 42 is shown in FIG. 8. The figure shows an electron backscatter defraction (EBSD) image of gallium telluride ($Ga_2Te_3$) dispersed phase 44 in bismuth telluride ($Bi_2Te$) matrix phase 42. The image shown is an inverse pole map of the EBSD image. The sample is a polished surface and regions 44 are gallium telluride ($Ga_2Te_3$) dispersoids. Three bismuth telluride matrix grains are evident. Lower grain 90 is separated from middle bismuth telluride grain 92 by grain boundary 88. Middle bismuth telluride grain 92 is separated from upper bismuth telluride grain 94 by grain boundary 77.

A predominant feature of EBSD inverse pole maps is that the specific crystalline orientation normal to the sample surface is indicated by specific shading in the image. As such, the micrograph in FIG. 8 can be interpreted as indicating that many of the gallium telluride dispersoids in middle grain 92 have similar or identical orientations with respect to middle matrix grain 92 orientation. Similarly dispersoids 44 in upper grain 94 have identical shading indicating a similar or identical epitaxial relation with upper grain 94.

EXAMPLE 8

Figure 9:
FIG. 9 is a scanning electron micrograph of copper telluride dispersoids in a bismuth telluride selenide matrix.
Figure 10:
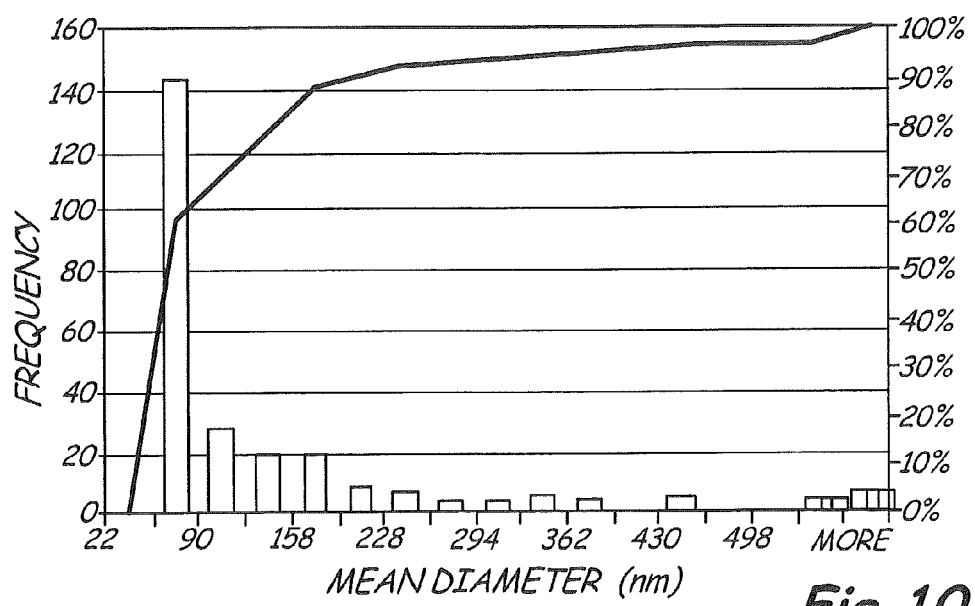
FIG. 10 is a plot showing the size distribution of the copper telluride dispersoids in FIG. 9.

FIG. 9 is a scanning electron micrograph of bismuth telluride selenide containing 10 atomic percent loading of copper telluride with the composition $(BiTe_{2.7}Se_3)_{0.9} (Cu_xTe_y)_{0.1}$. The copper telluride dispersoids appear as dark spots. An areal image analysis was made of the micrograph to determine the statistical distribution of the size of the dispersed phases. The results of the image analysis are plotted in FIG. 10 and are summarized in this following table.

| Volume % | Average Diameter | Minimum Diameter | Maximum Diameter | 80$^{th}$ Percentile | 50$^{th}$ Percentile |
|---|---|---|---|---|---|
| 10.8 | 93.5 nm | 21.8 nm | 925.5 nm | 123.5 nm | 47.6 nm |

In this sample, all dispersoids were submicron in size and half were sub 47.6 nm in size.

EXAMPLE 9

Figure 11:
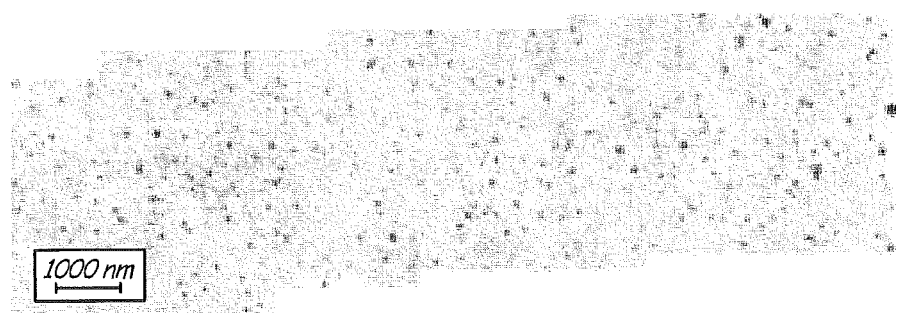
FIG. 11 is a scanning electron micrograph of copper telluride dispersoids in a bismuth telluride matrix.
Figure 12:
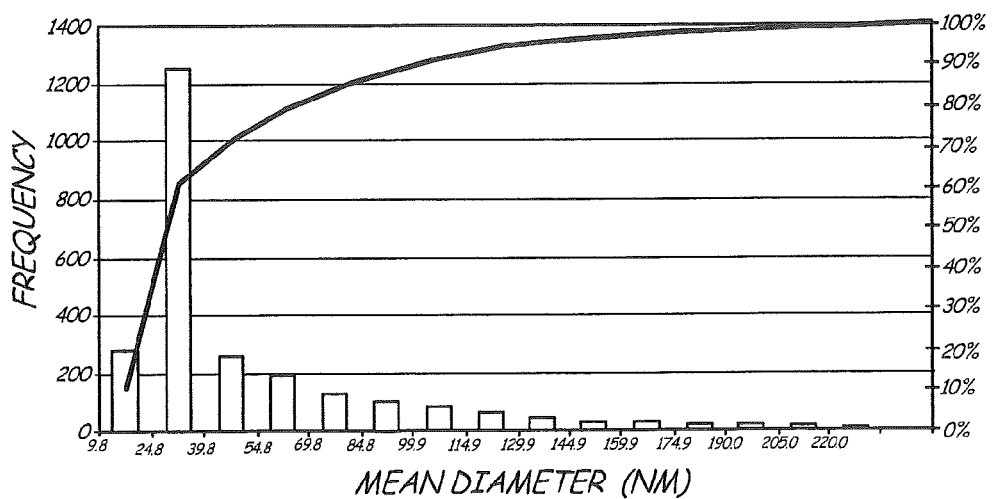
FIG. 12 is a plot showing the size distribution of the copper telluride dispersoids in FIG. 11.

FIG. 11 is a scanning electron micrograph of bismuth telluride selenide containing 10 atomic percent loading of copper telluride with the composition $(BiTe_{2.7}Se_3)_{0.9} (Cu_xTe_y)_{0.1}$. The copper telluride dispersoids appear as dark spots. An areal image analysis was made of the micrograph to determine the statistical distribution of the size of the dispersed phases. The results of the image analysis are plotted in FIG. 12 and are summarized in this following table.

| Volume % | Average Diameter | Minimum Diameter | Maximum Diameter | 80$^{th}$ Percentile | 50$^{th}$ Percentile |
|---|---|---|---|---|---|
| 10.1 | 38.3 nm | 9.76 nm | 1.42 μm | 58.0 nm | 18.2 nm |

In this sample, all dispersoids were less than 1.42 μm in size and half were less than 18.2 nm in size.

In summary, semiconductor based bulk thermoelectric material systems have been identified that exhibit high ZT figures of merit. The materials consist of semiconducting host phases containing at least partially coherent submicron dispersed phases formed by at least a quench anneal process. The mechanism responsible for the ZT improvement is suggested to be phonon transport impedance due to the strain fields associated with each partially coherent submicron dispersoid phase. Inventive host phases include at least doped and undoped bismuth telluride and inventive dispersoid phases include at least binary or ternary bismuth or tellurium compounds.

Although the present invention has been described with reference to preferred embodiments, workers skilled in the art will recognize that changes may be made in form and detail without departing from the spirit and scope of the invention.

The invention claimed is:

1. A bulk thermoelectric material comprising:
   a length, a width, and a thickness, wherein the length, width and thickness are each at least about 30 μm;
   a host phase comprising bismuth telluride;
   a dispersed phase comprising a second material forming a plurality of inclusions;
   an interface between the host phase and the dispersed phase that is substantially coherent in one crystallographic direction;
   wherein the host phase and the dispersed phase are crystalline with lattice parameters of the dispersed phase being within about ±10% of lattice parameters of the host phase; and
   a thermoelectric figure of merit (ZT) greater than or equal to 1.0 at temperatures less than 200° C.

2. The bulk thermoelectric material of claim 1, wherein the dispersed phase comprises substantially spheroidal inclusions.

3. The bulk thermoelectric material of claim 1, wherein the dispersed phase comprises substantially lamellar or rod-like inclusions.

4. The bulk thermoelectric material of claim 1, wherein the host phase and dispersed phase share at least one chemical element between them.

5. The bulk thermoelectric material of claim 1, wherein each inclusion has a smallest dimension that measures between about 1 nanometers (nm) and about 1 micron (μm).

6. The bulk thermoelectric material of claim 5, wherein about half the inclusions measure between about 10 nm and about 50 nm across the smallest dimension.

7. The bulk thermoelectric material of claim 5, wherein substantially all of the inclusions measure between about 10 nm and about 50 nm across the smallest dimension.

8. The bulk thermoelectric material of claim 1, wherein the host phase and the dispersed phase are crystalline with lattice parameters of the dispersed phase being within about ±5% of lattice parameters of the host phase.

9. The bulk thermoelectric material of claim 8, wherein the host phase and the dispersed phase are crystalline with the lattice parameters of the dispersed phase being within about ±2% of the lattice parameters of the host phase.

10. The bulk thermoelectric material of claim 1, wherein the dispersed phase has a surface area to volume ratio, defined by a sum of an outer surface area of the inclusions of the dispersed phase divided by the total volume of the sample, the surface area to volume ratio of the dispersed phase being at least about 0.08 nm$^{-1}$.

11. The bulk thermoelectric material of claim 10, wherein the surface area to volume ratio of the dispersed phase is at least about 0.10 nm$^{-1}$.

12. The bulk thermoelectric material of claim 10, wherein the surface area to volume ratio of the dispersed phase is not more than about 0.30 nm$^{-1}$.

13. The bulk thermoelectric material of claim 1, wherein presence of the dispersed phase in the bulk thermoelectric material causes a reduction in phonon thermal conductivity ($k_{ph}$) at least about 10% greater than an increase in electrical resistivity ($\rho$) compared to $k_{ph}$ and $\rho$ of the host phase alone.

14. The bulk thermoelectric material of claim 13, wherein the reduction in $k_{ph}$ is at least about 50% greater than the increase in $\rho$.

15. The bulk thermoelectric material of claim 14, wherein the reduction in $k_{ph}$ is at least about 100% greater than the increase in $\rho$.

16. The bulk thermoelectric material of claim 1, wherein presence of the dispersed phase in the bulk thermoelectric material causes an increase of ZT of at least about 10% compared to the host phase alone.

17. The bulk thermoelectric material of claim 16, wherein the increase in ZT is at least about 50%.

18. The bulk thermoelectric material of claim 17, wherein the increase in ZT is at least about 100%.

19. The bulk thermoelectric material of claim 1, wherein the host phase is doped, undoped, or self-doped bismuth telluride $Bi_{2-a}X_aTe_3$ or $Bi_2X_aTe_{3-a}$, where X is a doping material selected from one of bismuth (Bi), lead (Pb), arsenic (As), tin (Sn), bromine (Br), iodine (I), and antimony (Sb); and a is a relative stoichiometric quantity of X.

20. The bulk thermoelectric material of claim 19, wherein X is selenium (Se) or antimony (Sb) and α is greater than 0.

21. The bulk thermoelectric material of claim 19, wherein the dispersed phase includes one or more of:
- a binary bismuth compound;
- a binary tellurium compound;
- a ternary bismuth compound; and
- a ternary tellurium compound.

22. The bulk thermoelectric material of claim 21 wherein the dispersed phase is a binary tellurium compound or a ternary tellurium compound and contains at least one of: aluminum (Al), chromium (Cr), cobalt (Co), copper (Cu), iridium (Ir), iron (Fe), gallium (Ga), germanium (Ge), molybdenum (Mo), osmium (Os), rhenium (Re), ruthenium (Ru), silicon (Si), silver (Ag), tantalum (Ta), tungsten (W), vanadium (V), and zinc (Zn).

23. The bulk thermoelectric material of claim 21, wherein the dispersed phase is a binary tellurium compound or a ternary tellurium compound and contains at least one of: copper (Cu), gallium (Ga), germanium (Ge), silver (Ag), and zinc (Zn).

24. The bulk thermoelectric material of claim 21, wherein the dispersed phase is a binary tellurium compound or a ternary tellurium compound and contains at least one of: copper (Cu), gallium (Ga), and silver (Ag).

25. The bulk thermoelectric material of claim 19, wherein the dispersed phase comprises at least one of: aluminum telluride ($Al_2Te_3$), chromium telluride ($Cr_2Te_3$), cobalt telluride (CoTe), copper telluride (CuTe), dicopper telluride ($Cu_2Te$), copper-deficient dicopper telluride ($Cu_xTe$, where $1.0<x<2.0$), iridium telluride ($IrTe_2$), iron telluride (FeTe), gallium tritelluride ($Ga_2Te_3$), germanium telluride (GeTe), molybdenum telluride ($MoTe_2$), osmium telluride ($OsTe_2$), rhenium telluride ($ReTe_2$), ruthenium telluride ($RuTe_2$), silicon telluride ($SiTe_2$), silver telluride ($Ag_2Te$), tantalum telluride ($TaTe_2$), tungsten telluride ($WTe_2$), vanadium telluride ($VTe_2$), and zinc telluride (ZnTe).

26. The bulk thermoelectric material of claim 19, wherein the dispersed phase comprises at least one of: copper telluride (CuTe), dicopper telluride ($Cu_2Te$), copper-deficient dicopper telluride ($Cu_xTe$, where $1.0<x<2.0$), gallium telluride ($Ga_2Te_3$), germanium telluride (GeTe), disilver telluride ($Ag_2Te$), and zinc telluride (ZnTe).

27. The bulk thermoelectric material of claim 19, wherein the dispersed phase comprises at least one of: copper telluride (CuTe), dicopper telluride ($Cu_2Te$), copper-deficient dicopper telluride ($Cu_xTe$, where $1.0<x<2.0$), and silver telluride ($Ag_2Te$).

28. The bulk thermoelectric material of claim 1 wherein the host phase is self doped bismuth telluride, $Bi_{2+a}Te_3$ wherein a is greater than or equal to about −0.75 and is less than about 0.825.

29. The bulk thermoelectric material of claim 1, wherein the dispersed phase is doped with at least one of: copper (Cu), gold (Au), lead (Pb), cadmium (Cd), nickel (Ni), zinc (Zn), platinum (Pt), mercury (Hg), magnesium (Mg), silicon (Si), boron (B), gallium (Ga), carbon (C), germanium (Ge), indium (In), tin (Sn), antimony (Sb), arsenic (As), aluminum (Al), phosphorus (P), and silver (Ag).

30. The bulk thermoelectric material of claim 1, wherein a percent atomic composition of the dispersed phase is less than or equal to about 40%.

31. The bulk thermoelectric material of claim 30, wherein the percent atomic composition of the dispersed phase is less than or equal to about 25%.

32. The bulk thermoelectric material of claim 31, wherein the percent atomic composition of the dispersed phase is less than or equal to about 15%.

33. The bulk thermoelectric material of claim 32, wherein the percent atomic composition of the dispersed phase is between about 2% and about 12%.

34. A method for making a thermoelectric material, the method comprising:
heating a mixture of an initial materials to form a melt, wherein the materials may consist of (i) simple elements, (ii) binary compounds or (iii) ternary alloys;
solidifying the melt to induce phase separation, forming a bulk material comprising a host phase comprising bismuth telluride and a dispersed phase of inclusions; and
heat treating the bulk material to further precipitate the dispersed phase from the host phase and homogenize both phases wherein the dispersed phase is aligned with the and coherent in at least one crystallographic direction and the host phase and the dispersed phase are crystalline with lattice parameters of the dispersed phase being within about ±10% of lattice parameters of the host phase, so that the bulk material has a thermoelectric figure of merit (ZT) greater than or equal to 1.0 at temperatures less than 200° C.

35. The method of claim 34, wherein the mixture of materials are (i) simple elements, (ii) binary compounds or (iii) ternary alloys, wherein the simple elements are selected from the group consisting of: bismuth (Bi), tellurium (Te) and/or antimony (Sb) and one or more of the following: thallium (Tl), selenium (Se), aluminum (Al), chromium (Cr), cobalt (Co), copper (Cu), iridium (Ir), iron (Fe), gallium (Ga), germanium (Ge), molybdenum (Mo), osmium (Os), rhodium (Rh), ruthenium (Ru), silicon (Si), silver (Ag), tantalum (Ta), tungsten (W), vanadium (V) or zinc (Zn), the binary compounds are selected from the group consisting of bismuth telluride ($Bi_2Te_3$), bismuth selenide ($Bi_2Se_3$), and/or antimony telluride ($Sb_2Te_3$), and one or more of the following: thallium telluride ($Tl_2Te_3$), aluminum telluride ($Al_2Te_3$), chromium telluride ($Cr_2Te_3$), cobalt telluride (CoTe), copper telluride ($Cu_2Te$), $Cu_xTe$ where $1.0<x<2.0$, iridium telluride ($IrTe_2$), iron telluride (FeTe), gallium telluride ($Ga_2Te_2$), germanium telluride (GeTe), molybdenum telluride ($MoTe_2$), osmium telluride ($OsTe_2$), rhodium ($RhTe_2$), ruthenium telluride ($RuTe_2$), silicon telluride ($SiTe_2$), silver telluride ($Ag_2Te$), tantalum telluride ($TaTe_2$), tungsten telluride (WTe2), vanadium telluride ($VTe_2$) or zinc telluride (ZnTe), and the ternary alloys are selected from the group consisting of $Bi_2Te_{1-x}Se_x$, $Sb_{2-x}Bi_xSe_3$.

36. The method of claim 34, further comprising, after the heat treating step, treating the thermoelectric material with one or more thermal or mechanical processes.

37. The method of claim 34, wherein heating the mixture and solidifying the melt comprise one or more of the following processes: melt quenching; splat quenching, ribbon spinning, inert gas powder atomization followed by post powder formation consolidation; and vacuum casting, mechanical alloying, mechanical attrition, mechanical mixing, directional solidification, injection mold processing, or reduction from an oxide.

38. The method of claim 34 wherein heat treating comprises annealing to selectively induce phase separation and homogenization with desired aspect ratios and coherency of the dispersed phase within the host phase.

39. The method of claim 34, wherein heating the mixture and solidifying the melt comprises melt quenching.

40. The method of claim 34, wherein heating the mixture comprises:
  placing the mixture into a quartz ampoule;
  ramping the temperature at about 10° C. per minute until the material reaches about 800° C.; and
  holding the mixture at 800° C. for about one hour to about 8 hours.

41. The method of claim 34, wherein solidifying the melt comprises quenching the melt in an ice water bath.

42. The method of claim 34 wherein heat treating the bulk material comprises holding the bulk material at about 390° C. for about four days.

* * * * *